United States Patent
Taguchi

(10) Patent No.: US 6,915,474 B2
(45) Date of Patent: Jul. 5, 2005

(54) TURBO DECODING APPARATUS AND DECODING ITERATION COUNT CONTROLLING METHOD IN TURBO DECODING

(75) Inventor: Atsushi Taguchi, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 434 days.

(21) Appl. No.: 10/142,776

(22) Filed: May 13, 2002

(65) Prior Publication Data

US 2002/0183981 A1 Dec. 5, 2002

(30) Foreign Application Priority Data

May 15, 2001 (JP) .................................... 2001-144710

(51) Int. Cl.[7] .............................................. H03M 13/00
(52) U.S. Cl. ................................. 714/755; 714/780
(58) Field of Search ................................ 714/780, 786, 714/794, 795, 760, 752, 792, 755; 375/262, 341

(56) References Cited

U.S. PATENT DOCUMENTS

| | | |
|---|---|---|
| 5,761,248 A | 6/1998 | Hagenauer et al. |
| 5,983,384 A | 11/1999 | Ross |
| 6,166,667 A | 12/2000 | Park |
| 6,526,531 B1 * | 2/2003 | Wang .......................... 714/704 |
| 6,671,852 B1 * | 12/2003 | Ariel et al. ................. 714/793 |
| 6,686,853 B2 * | 2/2004 | Shen et al. ................... 341/50 |
| 2002/0061079 * | 5/2002 | Bass .......................... 375/341 |

FOREIGN PATENT DOCUMENTS

| | | |
|---|---|---|
| EP | 0755122 | 1/1997 |
| JP | 2000-183758 | 6/2000 |
| JP | 2000-216689 | 8/2000 |
| JP | 2001-127647 | 5/2001 |
| JP | 2001-127649 | 5/2001 |

* cited by examiner

*Primary Examiner*—Christine T. Tu
(74) *Attorney, Agent, or Firm*—Greenblum & Bernstein, P.L.C.

(57) ABSTRACT

With attention focused on the most significant bit (sign indicating positive or negative) of a soft decision value, the present invention provides a method of deciding whether iterations of soft decision decoding of turbo decoding should be terminated or not. A change of a positive/negative bit value included in a soft decision result for each bit of a received codeword is monitored. When the values of the positive/negative bits cease to fluctuate and such a tendency is observed for almost all bits of the received codeword, it is decided that the positive/negative bits have converged. Termination of iterations of soft decision decoding is determined based on the decision result.

8 Claims, 9 Drawing Sheets

TURBO DECODING APPARATUS AND DECODING ITERATION COUNT CONTROLLING METHOD IN TURBO DECODING

BACKGROUND OF THE INVENTION

1. Field of the Invention

The present invention relates to a turbo decoding apparatus and a decoding iteration count controlling method in turbo decoding.

2. Description of the Related Art

A turbo coder outputs transmit data itself, data obtained by converting the transmit data to a convolutional-coded data (first redundant bit) and data obtained by interleaving and convolutional-coding the transmit data (second redundant bit).

On the other hand, the turbo decoder performs soft decision decoding (estimation of transmitted data) using two decoders corresponding to two convolutional codes. Then, the turbo decoder feeds back the decoding result of one decoder to another decoder and iterates this processing. Then, the turbo decoder finally makes a hard decision to confirm "1" and "0" of the data.

The reliability of turbo decoding increases as the number of iterations of soft decision decoding increases.

However, as the number of iterations increases, the time required for decoding also increases and a processing delay becomes not negligible.

Furthermore, when the number of iterations of soft decision decoding increases, the load on processing such as path calculation based on a Viterbi algorithm.

This raises a problem of increasing power consumption of the circuit as well. Therefore, it is an important problem when iterations of decoding should be terminated.

The following methods are proposed as methods for controlling the number of decoding iterations:

① Method whereby a soft decision value of immediately preceding processing is compared with a soft decision value of current processing and iteration is terminated when there is no difference (European Patent Laid-Open Publication EP0755122A2).

② Method whereby an output value (soft decision value) of a soft decision decoder is compared with a limit value and iteration is terminated when the output value is close to the limit value or when saturation of data changes is detected in a large number of bits (Unexamined Japanese Patent Publication No. 2000-216689).

③ Method whereby a test bit is added to data to be coded during coding, the presence or absence of any error is checked using the test bit every time soft decision decoding is performed and it is decided based on the test result whether further decoding should be performed or not (Unexamined Japanese Patent Publication No. 2000-183758).

The above-described technologies ① and ② decide whether not to terminate iterations focused on a soft decision value (information of a plurality of bits), and therefore require complicated calculations.

Furthermore, the technology ③ conducts a check on the test bit for each decoding, and therefore the processing is complicated.

It is an object of the present invention to simplify processing of deciding whether or not to terminate iterations of soft decision decoding in turbo decoding and alleviate the processing load on the turbo decoding circuit.

SUMMARY OF THE INVENTION

The present invention focuses on the most significant 1 bit (bit indicating positive or negative) of a soft decision value. Then, the present invention monitors the saturation situation of this most significant 1 bit and uses the monitoring result as an index (standard or reference) to decide whether or not to terminate iterations of decoding.

When the reliability of the index is decided to be high or especially a high processing speed is required under various conditions, it is also possible to decide whether a hard decision should be made or not based on only the index.

Or it is also possible to make a decision under other conditions when the index is obtained.

For example, suppose a soft decision value is "+0.88 (decimal notation)".

"+" in this case means that the bit is estimated to be "1".

Furthermore, "0.88" represents the likelihood.

"−" means that the bit is estimated to be "0".

The present invention does not consider information of the likelihood at least at the beginning and when it is estimated that there are no longer variations of "+, −" of a soft decision value for each bit of a received codeword (which is a unit in carrying out decoding of a received signal and may also be referred to as "decoded frame") (saturation tendency) and such a tendency is observed in all bits, the present invention decides termination of iterations of decoding or makes a stricter decision on whether or not to terminate iterations with also other information taken into account.

In the case where decoding may be terminated, a positive/negative sign for each bit should have at least converged.

Moreover, since this positive/negative sign constitutes one bit, it is easy to compare the previous value with the current value and decide convergence on all bits.

Thus, by deciding termination of decoding using convergence of the sign as a reference, it is possible to improve the decision efficiency.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS

With reference now to the attached drawings, embodiments of the present invention will be explained below.

(Embodiment 1)

Figure 1:
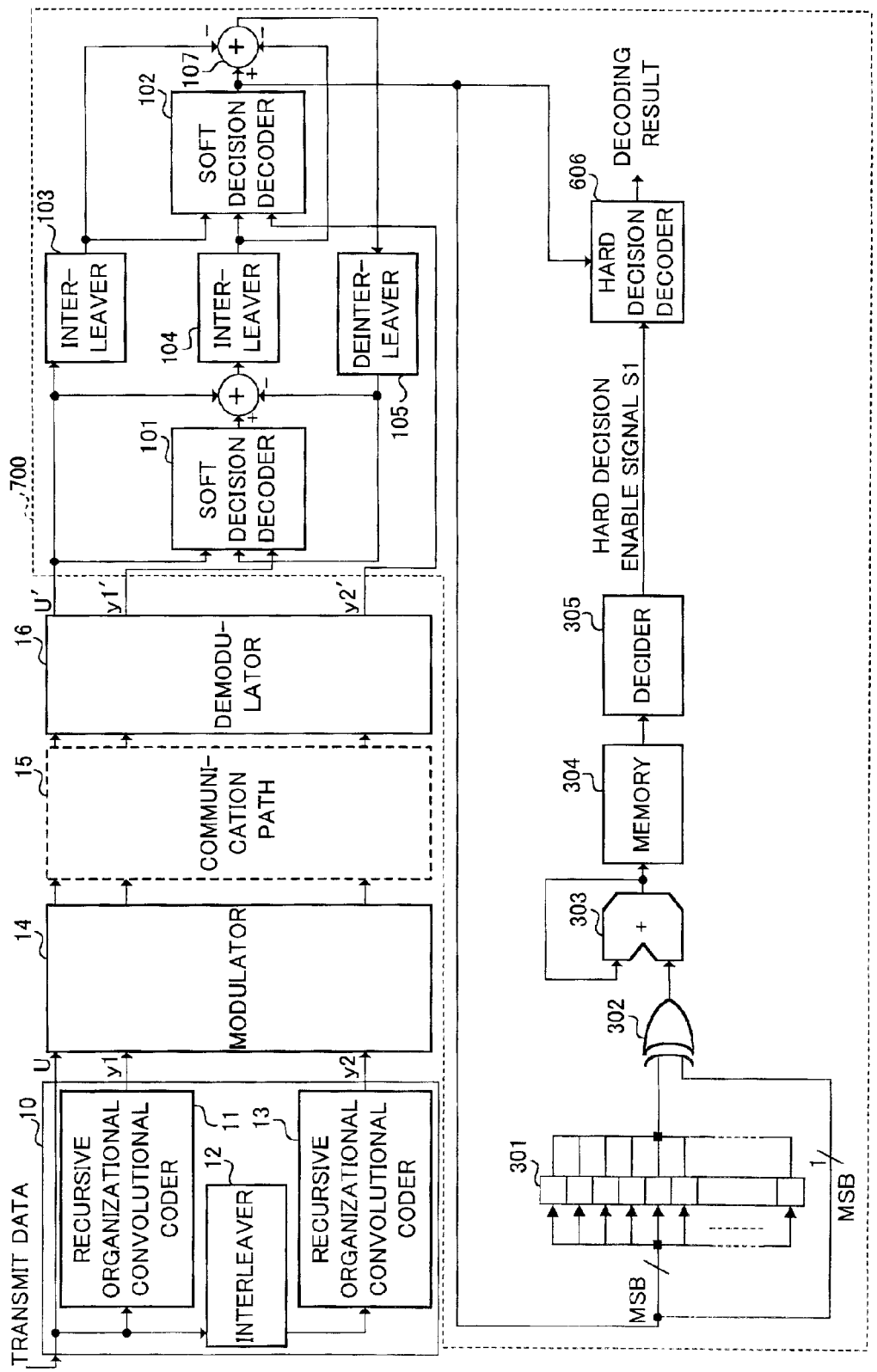
FIG. 1 is a block diagram showing a configuration of a turbo decoding apparatus according to Embodiment 1 of the present invention.

FIG. 1 shows a configuration example of a turbo decoding apparatus of the present invention.

From turbo coder 10, three types of signals u, y1 and y2 are output.

Output signal u is transmit data itself.

Output signal y1 is a signal obtained by applying coding processing by recursive organizational convolutional coder 11 to the transmit data.

Output signal y2 is a signal obtained by applying coding processing by recursive organizational convolutional coder 13 to a signal obtained by stirring the transmit data using interleaver 12.

Each signal (u, y1, y2) is received by modulator 14 and through communication path 15 and demodulated by demodulator 16.

The signal demodulated by demodulator 16 is affected by disturbance on transmission path 15 and contains errors. These signals are expressed as u', y1' and y2'.

These signals u', y1' and y2' are input to turbo decoder 700.

Turbo decoder 700 includes two soft decision decoders 101 and 102, interleavers 103 and 104, deinterleaver 105, adders 106 and 107, register 301, match detection circuit 302, cumulative adder 303, memory 304, decider 305 that decides whether iterations of decoding should be terminated or not and hard decision decoder 606.

Two soft decision decoders 101 and 102, interleavers 103 and 104, deinterleaver 105, adders 106 and 107 and the hard decider are elements making up a normal turbo decoder.

The output of soft decider 102 is fed back to soft decider 101 and soft decisions are conducted repeatedly. Upon reception of the soft decision result, a final hard decision is made by hard decider 606.

Decider 305 decides whether iterations of soft decision decoding should be terminated or not.

It is information obtained by monitoring the saturation state of the most significant 1 bit (bits indicating positive or negative) of the soft decision value that serves as an index for the decision.

That is, the saturation state of the most significant 1 bit of the soft decision value obtained from soft decision decoder 102 is monitored.

Then, the monitoring result is used as an index (standard) to decide whether iterations of decoding should be terminated or not.

Suppose the soft decision value is "+0.88 (decimal notation)". "+" in this case means that the bit is estimated to be "1".

Furthermore, "0.88" expresses the likelihood. Sign "−" means that the bit is estimated to be "0".

At least in the initial stage of decoding, this embodiment does not consider likelihood information and monitors a variation of the most significant 1 bit (sign bit indicating "+" or "−") of the soft decision value for each bit of the received codeword (unit in carrying out decoding of a received signal and may also be referred to as a "decoded frame").

Then, when variations of positive/negative bit (sign bit) are vanishing (saturation tendency) and such a tendency is estimated to be observed in all bits, termination of iterations of decoding is determined only based on the phenomenon.

That is, termination of iterations of decoding is decided only using convergence and saturation of coding as an index (standard).

The number of bits of register 301 corresponds to the number of bits of the received codeword (unit in carrying out coding/decoding and may also be referred to as a "decoded frame"). That is, if the received codeword has m bits, then register 301 also has a capacity of at least m bits.

Then, of the result (soft decision value) of nth (n: a natural number of 3 or more) soft decision decoding processing output from soft decision decoder 102, only the positive/negative bit (most significant 1 bit: MSB) for each bit of the received codeword is stored in register 301.

Then, of the nth (n: a natural number of 3 or more) result (soft decision value) of the soft decision decoding processing, only the positive/negative bit (most significant 1 bit: MSB) for each bit is stored in register 301.

When the (n+1)th soft decision result is obtained, match decision circuit (exclusive OR circuit) 302 decides a match/mismatch between the positive/negative sign bit (most significant 1 bit) for each bit of the received codeword and the positive/negative sign bit (1 bit) for each bit of the nth soft decision result stored in register 301.

That is, the positive/negative sign bit (one bit) for each bit of the received codeword after the (n+1)th soft decision is serially output from turbo decoder 700 bit by bit and supplied to match decision circuit (exclusive OR circuit) 302.

On the other hand, the sign bit of the corresponding bit with the previous soft decision value is read from register 302 and supplied to match decision circuit (exclusive OR circuit) 302.

When the values of two input bits match, match decision circuit 302 outputs "0", for example, and outputs "1" in the case of a mismatch.

Then, the number of mismatched bits is counted by cumulative adder 303 and the count value is stored in memory 304.

For example, if the sign bit (most significant bit) of the soft decision value is continuously the same for all bits of the received codeword, that is, if the previous and current positive/negative signs match, the output of match decision circuit 302 is "0" for all bits.

Therefore, the output of cumulative adder 303 also becomes "0".

In such a case, it can be estimated that variations of the most significant 1 bit ("+" or "−") of the soft decision value for each bit are vanishing and such a saturation tendency is observed in all bits.

Therefore, decider 305 gives signal S1 that enables a hard decision to hard decision decoder 606.

This completes iterations of soft decision and starts a hard decision for each bit of the received codeword.

Decision on termination of iterations of decoding in this embodiment will be explained using FIG. 2 and FIG. 3 more specifically.

Figure 2:
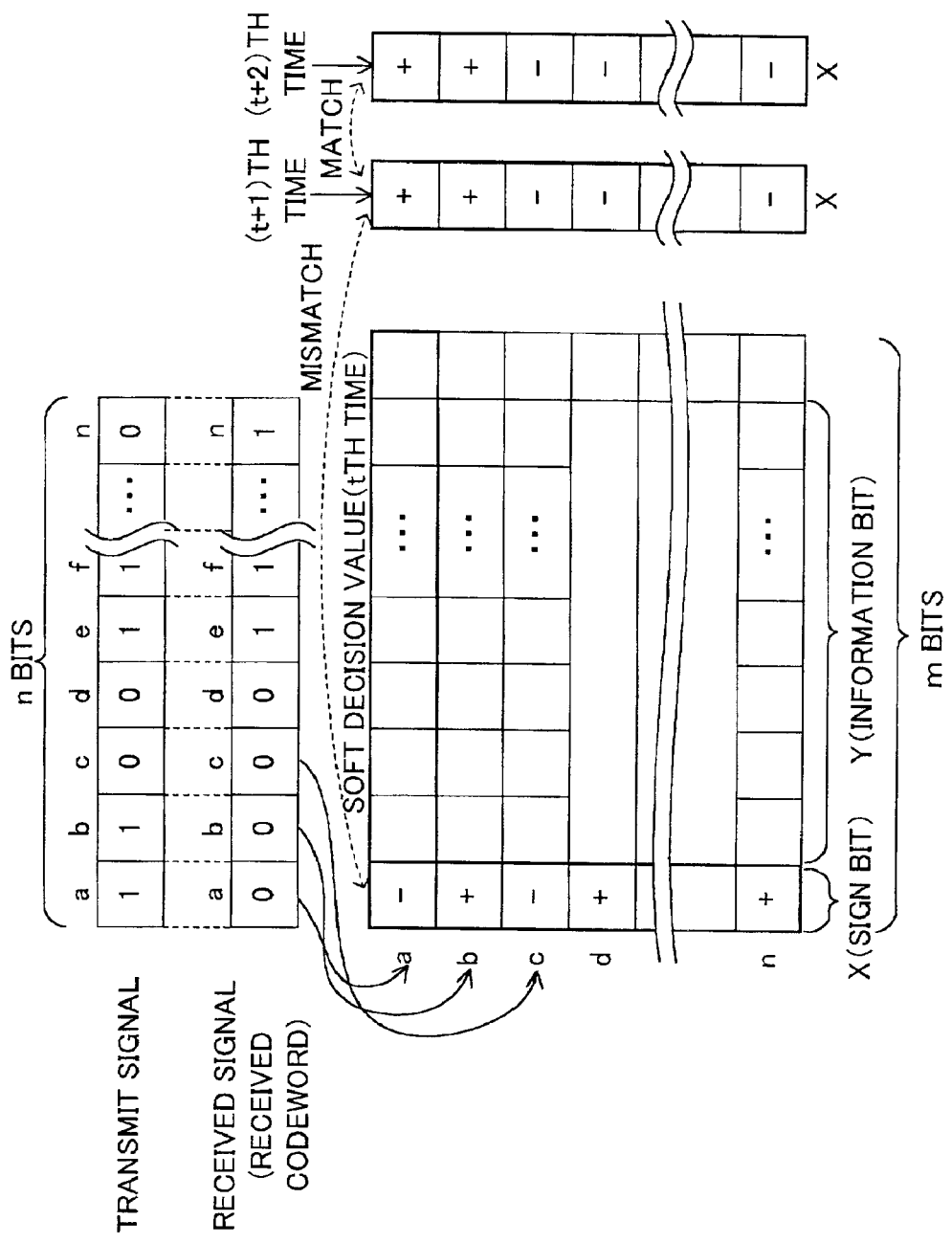
FIG. 2 illustrates a convergence decision of positive and negative bits (sign bits) included in a soft decision value.

A bit configuration of one transmitted codeword (coded/decoded frame) included in the transmit signal (output of a turbo code) is shown at the top of FIG. 2.

As shown in the figure, one transmit codeword (coded frame) consists of n-bit data. For convenience's sake, the bits are assigned codes "a" to "n" to distinguish bits. For example, the bits indicated with "a" to "n" are "110011 . . . 0".

Here, suppose such a transmit signal is affected by disturbance (for example, fading) on the transmission path, and becomes a received signal including errors as shown in the figure.

That is, the received signal becomes "000001 . . . 1".

Turbo decoder 700 in FIG. 1 iterates soft decision decoding to estimate original transmit data.

That is, a turbo code also has information of another codeword adjacent to one codeword convolutional-coded. Furthermore, interleaved information is also added as a redundant bit.

Taking into account this information, it is possible to estimate correct data from a received signal containing errors.

There are various types of a soft decision decoding method such as SOVA and MAP, but the soft decision decoding method is not limited to these types.

Here, suppose soft decision decoding is performed t times.

As a result of tth soft decision decoding, a soft decision value output from soft decision decoder 102 in FIG. 1 is m-bit data related to bits "a" to "n".

The m-bit data consists of the most significant 1 bit (sign bit indicating positive and negative) X and bit (information bit) Y indicating likelihood.

As described above, when sign bit X indicating positive and negative is "+", it means that the bit is estimated to be "1" and when sign bit X is "−", it means that the bit is estimated to be "0".

The likelihood information (information bit Y) indicates the reliability of soft decision.

Figure 3:
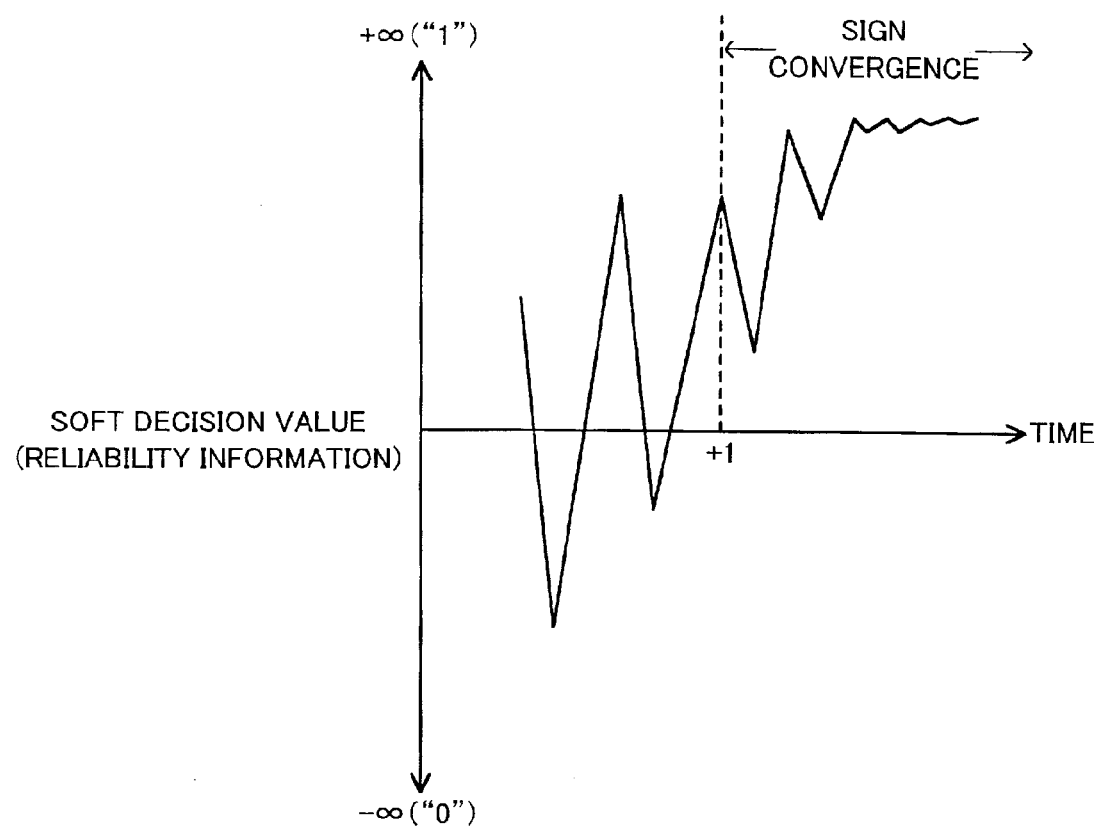
FIG. 3 illustrates an example of fluctuations of a soft decision value.

As shown in FIG. 3, in the beginning stage of iterative decoding, a received signal containing considerable errors due to influences of fading cannot be estimated accurately and the positive/negative sign of a soft decision value itself fluctuates.

However, when decoding is iterated several times, the positive/negative sign starts to converge (from time T1 on) and finally the likelihood information (reliability information) also converges.

From considerations on the convergence of the soft decision value in FIG. 3, it is understandable that a certain degree of convergence decision on the soft decision value can be conducted by only monitoring convergence of the positive/negative sign bit.

Therefore, this embodiment focuses on a change of sign bit X, which indicates positive or negative. That is, this embodiment monitors changes of the (t+1)th and (t+2)th sign bits for all bits (a to n).

In the case of FIG. 2, tth sign bit X and (t+1)th sign bit X do not completely match for all bits a to n.

However, (t+1)th sign bit X and (t+2)th sign bit X completely match for all bits a to n.

Therefore, it is possible to decide that when (t+1)th soft decision decoding is completed, the tendency of saturation of the soft decision value applies to all bits of the received codeword.

Here, convergence (saturation) of the positive/negative signs for all bits is considered as a condition, but the present invention is not limited to this.

Even if a mismatch of the positive/negative sign is detected for some bits, if the number of mismatched bits is smaller than a predetermined threshold, it is possible to decide that a saturation tendency of the soft decision value applies to almost all bits of the received codeword.

The information indicating that saturation of the soft decision value is detected on all bits (or a predetermined number of bits) is used as an index to decide whether termination is possible or not.

For example, in the case where the positive/negative signs converge (saturate) for all bits a to n, it is possible to enable a hard decision, terminate soft decision decoding or decide whether final termination is possible or not considering also other conditions after the index is obtained.

Figure 4:
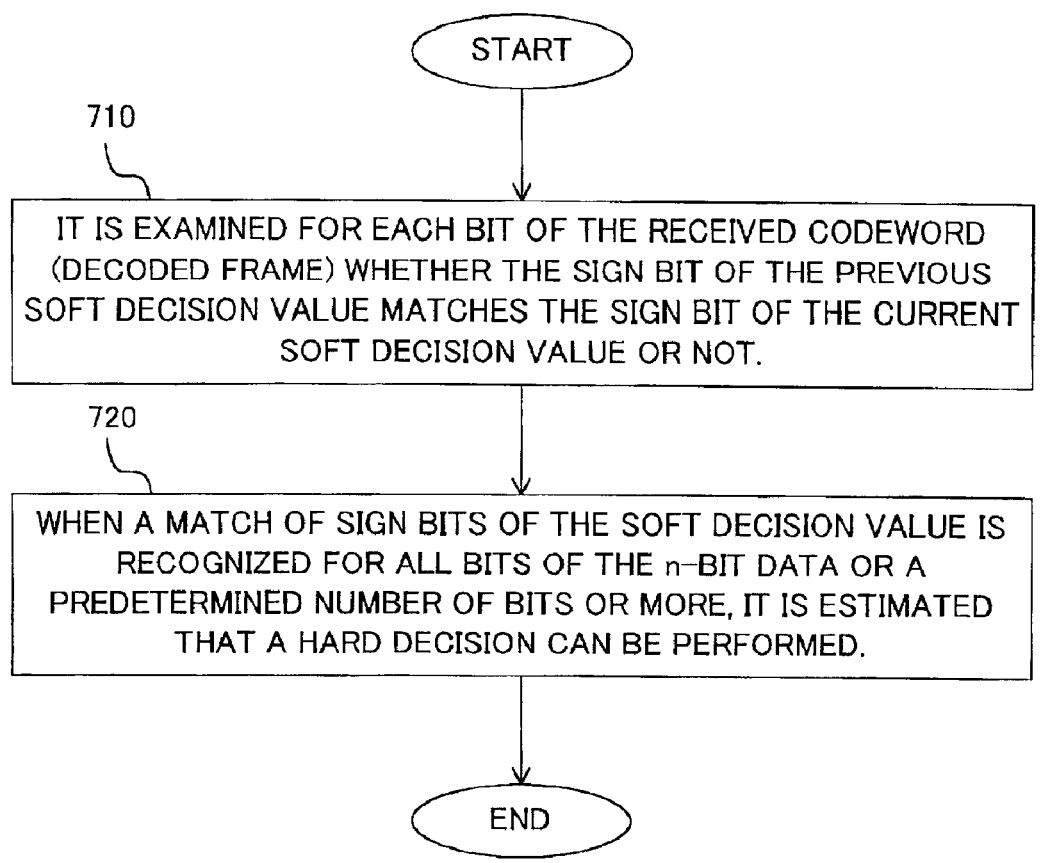
FIG. 4 is a flow chart showing a procedure for deciding termination (termination estimation) of soft decision decoding based on the positive and negative bits.

FIG. 4 shows a procedure for deciding whether decoding can be terminated or not according to this embodiment which has been described so far.

First, it is examined for each bit of the received codeword (decoded frame) whether the sign bit of the previous soft decision value matches the sign bit of the current soft decision value or not (step 710).

Then, when such a match is recognized for all bits or for a predetermined number of bits or more, it is estimated that a hard decision can be performed (termination of soft decision decoding is possible) (step 720).

Figure 5:
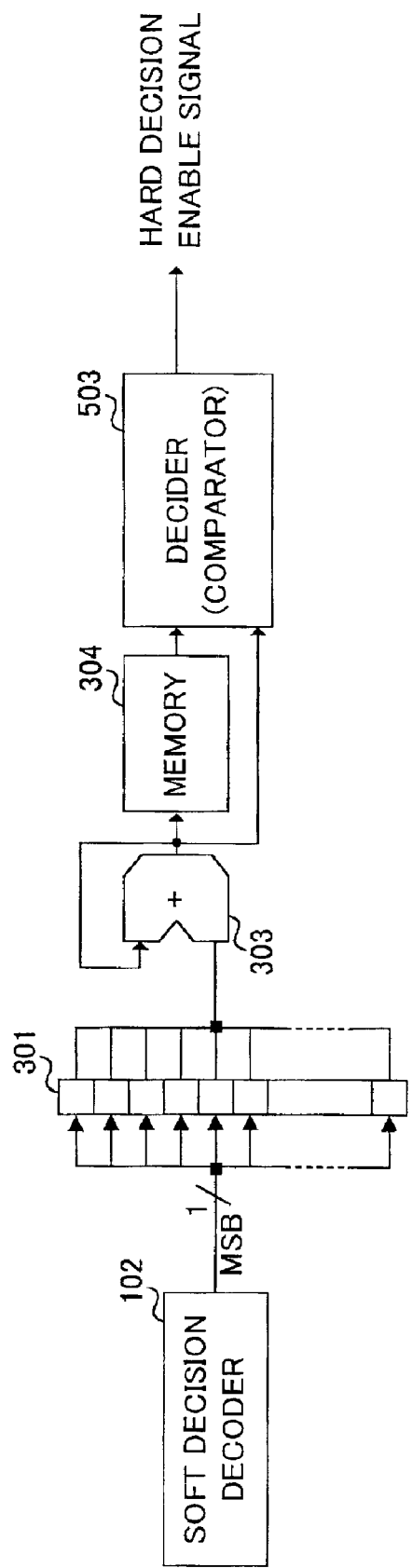
FIG. 5 is a block diagram showing a configuration of main components of a modification example of the present invention.

FIG. 5 shows a configuration of a modification example.

In FIG. 1, a match between the previous value and the current value is detected on the sign bit (most significant 1 bit) indicating positive or negative is detected and then cumulatively added.

In FIG. 5, the processing is carried out in the reverse order.

That is, a cumulative addition is performed on the previous soft decision value first. That is, the most significant 1 bit (sign bit indicating positive or negative) of the previous soft decision value is cumulatively added and the value resulting from the cumulative addition is stored in memory 304.

Then, decider (comparator) 503 compares the cumulative addition value of the most significant 1 bit of this soft decision value with the cumulative addition value stored in memory 304.

Though the order is different, basically the same processing as the processing in FIG. 1 is performed.

Figure 6:
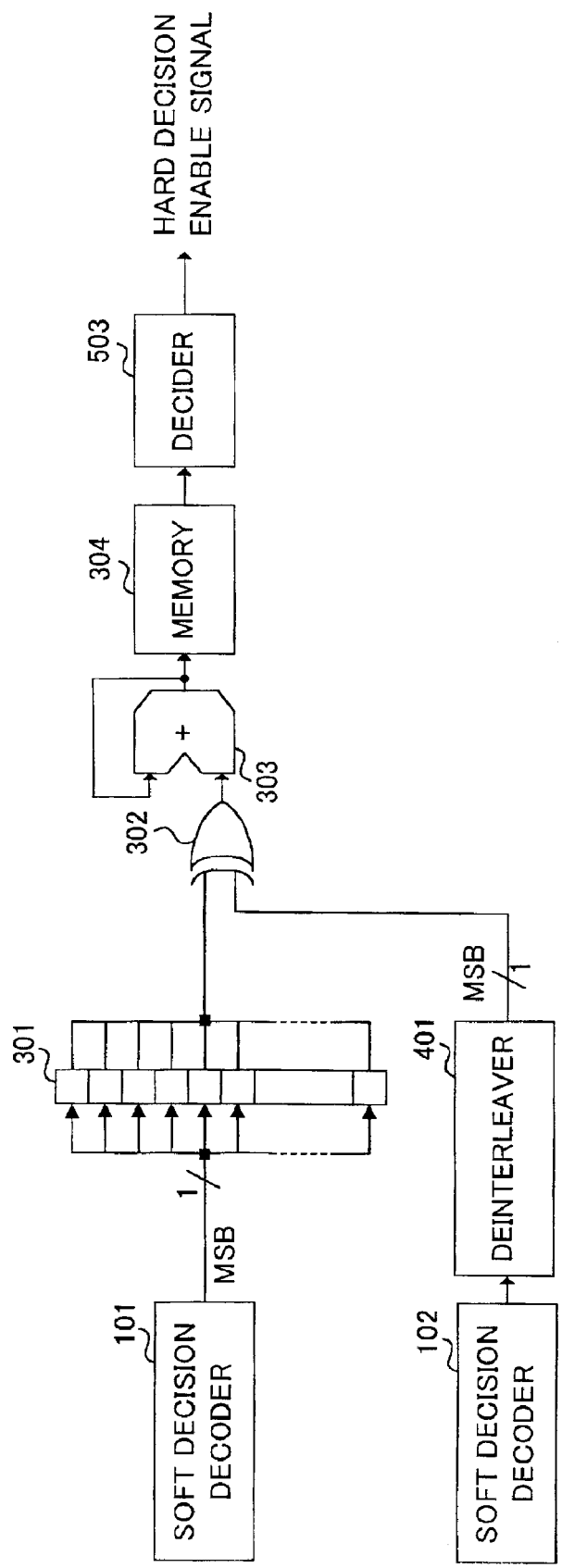
FIG. 6 is a block diagram showing a configuration of main components of another modification example of the present invention.

Furthermore, the configuration in FIG. 6 also performs basically the same processing as that of the configuration in FIG. 1 and FIG. 5.

However, in the case of FIG. 6, match detection circuit 302 detects a match between the outputs of both soft decider 101 and soft decider 102 shown in FIG. 1 (information of the most significant 1 bit of the soft decision value for each bit output from both deciders).

In this case, since data storage in register 301 and processing by deinterleaver 401 can be performed synchronously, there is a merit that it is easy to adjust timing between both data to be subjected to a match detection.

(Embodiment 2)

Figure 7:
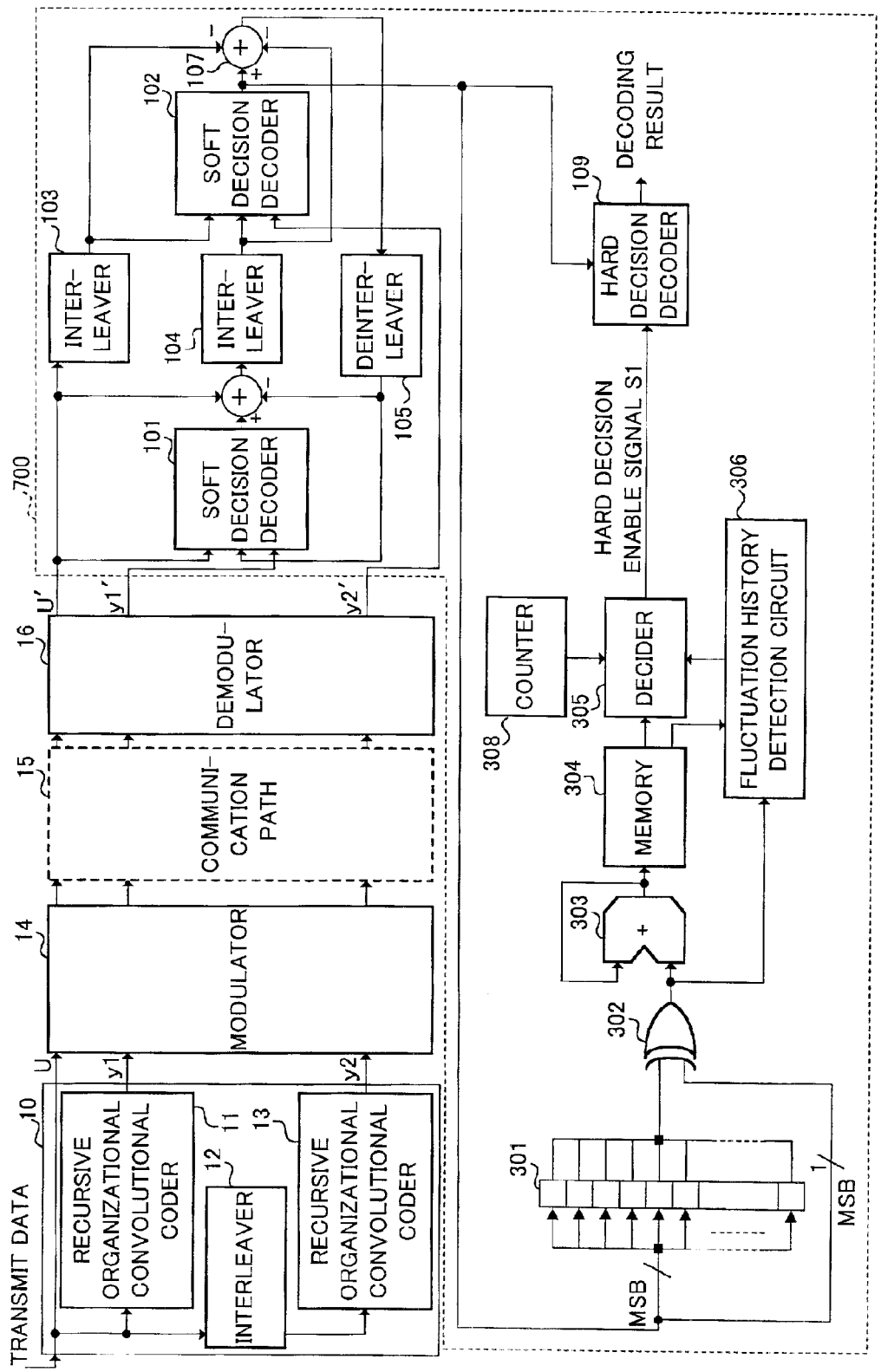
FIG. 7 is a block diagram showing a configuration of a turbo decoding apparatus according to Embodiment 2 of the present invention.

FIG. 7 is a block diagram showing another configuration of a turbo decoder according to the present invention. The basic configuration is the same as that in FIG. 1.

In this embodiment, when it is discovered through the processing described in the foregoing embodiment that the positive/negative signs have converged (saturated) for all bits making up one received codeword (or for a predetermined number of bits), it is decided whether final soft decision decoding should be terminated or not with reference to the past fluctuation situations (variation history) of the positive/negative signs (cumulative addition value) or the number of decoding iterations.

That is, when the cumulative addition value ceases to fluctuate and convergence is detected, decider 305 in FIG. 7 references the number of decoding iterations from counter 308.

Then, decider 305 checks whether decoding has been performed in excess of a minimum necessary count to secure the reliability of decoding or not.

When the minimum necessary count is not reached, decider 305 further continues decoding.

When the minimum necessary count is reached, decider 305 references the history of fluctuations of cumulative addition values or history of convergence for each bit detected by fluctuation history detection circuit 306.

Fluctuation history detection circuit 306 is fed not only cumulative addition values stored in memory 304 but also a signal indicating a match/mismatch for each bit output from match detection circuit 302.

For example, suppose there are fluctuations of a soft decision value as shown in FIG. 3.

Even if the positive/negative signs won't converge for all bits, if convergence is confirmed for a considerable number of bits (majority of bits) from an early stage (for example, T1 in FIG. 3), it can be estimated that convergence has been estimable from a quite early stage.

Therefore, the reliability of the decision can be decided to be quite high. Thus, signal S1 enabling a hard decision is output in this case.

In this embodiment, a decision is made using convergence of a positive/negative sign as an index and considering also other information in a comprehensive way. This improves the reliability of decisions.

(Embodiment 3)

Figure 8:
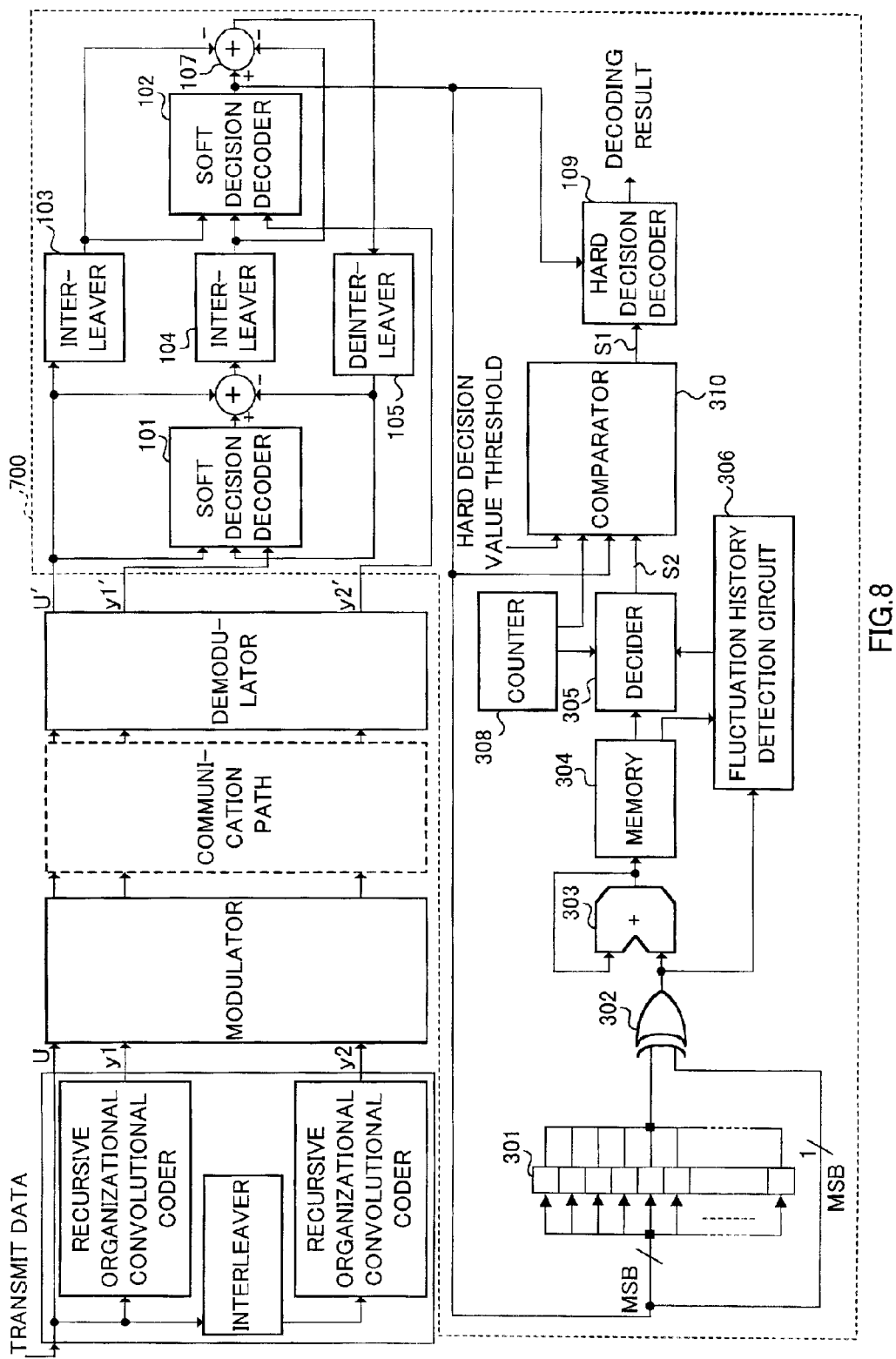
FIG. 8 is a block diagram showing a configuration of a turbo decoding apparatus according to Embodiment 3 of the present invention.

FIG. 8 is a block diagram showing another configuration of a turbo decoder according to the present invention.

The configuration of this embodiment is almost the same as that in FIG. 7.

In the foregoing two embodiments, likelihood information (soft decision value) itself is not used when it is finally decided whether iterations of soft decision decoding should be terminated or not. In this embodiment, likelihood information (soft decision value) is compared with a threshold and the order of approximation is checked in the final decision processing stage.

That is, the timing of making a final decision by comparator 310 in FIG. 7 is decided through a decision by decider 305 in this embodiment.

Upon reception of signal S2 indicating that it is possible to make a hard decision from decider 305, comparator 310 compares a threshold of the soft decision value (likelihood information) and a soft decision value output from soft decision decoder 102 and compares the order of approximation.

When a high order of approximation is found, comparator 310 decides that the soft decision value is converging and outputs hard decision enable signal S1.

On the other hand, even if the comparison result shows that there is no high order of approximation, comparator 310 checks the count of counter 308.

Then, when decoding has been performed a predetermined number of times (for example, an upper limit for stopping decoding), the comparator 310 outputs a hard decision enable signal.

This embodiment makes a decision using a likelihood value, and therefore provides high reliability.

Furthermore, since a decision using likelihood information is carried out through an advance convergence decision, there is no need to follow a complicated procedure of making an unnecessary complicated decision (comparison between likelihood information and a threshold and a decision on the order of approximation, etc.) for every soft decision decoding.

Thus, this embodiment provides high processing efficiency.

Figure 9:
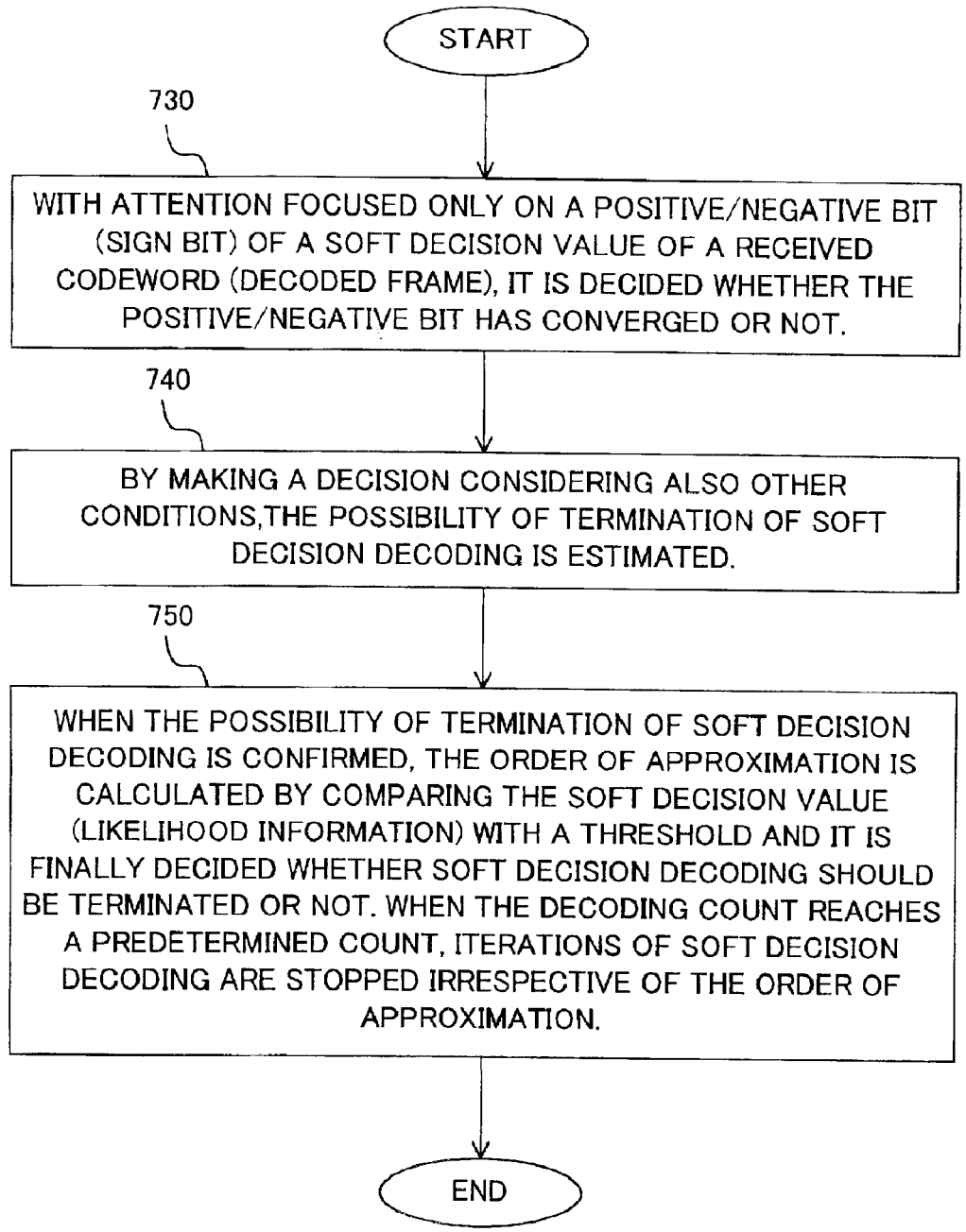
FIG. 9 is a flow chart showing an example of a processing procedure by the turbo decoding apparatus.

FIG. 9 summarizes the above-described processing.

That is, by focusing attention only on a positive/negative bit (sign bit) of a soft decision value of a received codeword (decoded frame), it is decided whether the positive/negative bit has converged or not (step 730).

By making a decision considering also other conditions, the possibility of termination of soft decision decoding is estimated (step 740).

When the possibility of termination of soft decision decoding is confirmed, the order of approximation is calculated by comparing the soft decision value (likelihood information) with a threshold and it is finally decided whether soft decision decoding should be terminated or not. When the decoding count reaches a predetermined count, iterations of soft decision decoding are stopped irrespective of the order of approximation (step 750).

The present invention is not limited to the above-described three embodiments, but can be modified or applied in various ways.

For example, as a signal used to decide convergence of a positive/negative bit (sign bit), it is also possible to use output signals of a plurality of soft decision decoders making up a turbo decoding apparatus. It is also possible to use output signals from an interleaver and deinterleaver.

It is also possible to make a decision on convergence of a positive/negative bit by carrying out a plurality of decision processes and combining the results.

The present invention decides whether or not to terminate decoding using convergence of a positive/negative bit (sign bit) as an index. Therefore, it is possible to improve the efficiency of the decision.

That is, the processing circuit processes one-bit information, and therefore the configuration of the processing circuit is simple. The circuit consumes less power. The processing circuit can also reduce the time required for turbo decoding processing.

Furthermore, when importance is attached to the processing speed in making a decision as to whether soft decision decoding should be terminated or not, it is also possible to decide whether soft decision decoding should be terminated or not according to the convergence situation (information on a decoding count as required) of a positive/negative bit (sign bit).

Furthermore, when higher reliability is required, it is also possible to make a decision under other conditions after convergence of the positive/negative bit has been confirmed and a stricter decision can also be made using a soft decision value (likelihood information).

Thus, the present invention can perform a variety of types of decision processing as required using a decision on convergence of the positive/negative bit (sign bit) as an index.

Thus, the present invention can improve the efficiency of processing of making a decision on termination of decoding.

Such improvement of efficiency of processing of making a decision on termination of decoding is required especially in the case where a turbo decoding apparatus is installed in an apparatus requiring strict real-time responsivity of communications such as a cellular phone. Thus, the present invention has great effects in actual applications.

As described above, the present invention can drastically improve the efficiency in making a decision as to whether decoding should be terminated or not.

This improves the processing speed of turbo decoding.

The present invention also eliminates redundant decoding operations of the turbo decoder and can thereby reduce power consumption of the apparatus.

Furthermore, the present invention can be implemented by only adding a simple circuit to an existing turbo decoding circuit, and therefore the present invention can be implemented easily.

The present invention is not limited to the above described embodiments, and various variations and modifications may be possible without departing from the scope of the present invention.

This application is based on the Japanese Patent Application No. 2001-144710 filed on May 15, 2001, entire content of which is expressly incorporated by reference herein.

What is claimed is:

1. A method of controlling a decoding iteration count in turbo decoding, comprising:

monitoring a value of a positive/negative bit in a current soft decision result of each bit in a received codeword, and detecting that the value of the positive/negative bit matches a value of a positive/negative bit in a previous soft decision result of the each bit;

deciding whether or not the current and previous positive/negative bits show a tendency to match for all bits in the received codeword; and deciding whether or not to terminate an iteration of soft decision decoding based on the decision.

2. A method of controlling a decoding iteration count in turbo decoding, repeatedly performing a soft decision on a received codeword comprising a plurality of bits, obtaining a soft decision decoding result including positive/negative information that indicates which one of 1 and 0 a bit is more likely to be and likelihood information upon every soft decision, and performing a hard decision based on the result of the soft decision decoding, the method comprising:

monitoring fluctuation in positive/negative information in the result of soft decision decoding of each bit in the received codeword, examining whether the fluctuation in the positive/negative information converges and whether the positive/negative information has a tendency toward a convergence for all bits in the received codeword, and deciding the convergence of the positive/negative information; and deciding whether or not to terminate an iteration of soft decision decoding based on the convergence decision.

3. The turbo decoding iteration count control method according to claim 2, wherein the deciding decides whether or not to terminate the iteration of soft decision decoding based only on the convergence decision.

4. The method of claim 2, wherein, when the deciding decides to terminate the iteration of soft decision decoding based only on the convergence decision, the deciding further decides whether or not to terminate the iterations of soft decision decoding based on at least one of a history of fluctuation in the positive/negative information and a count of soft decision decoding that has been executed.

5. The method of claim 2, wherein, when the deciding decides to terminate the iteration of soft decision decoding based only on the convergence decision result, the deciding comprises comparing a value of a likelihood included in a soft decision value to a predetermined threshold and makes a final decision of whether or not to terminate the iteration of soft decision decoding.

6. A turbo decoding apparatus comprising:

a soft decision decoder;

a decider that monitors values of positive/negative bits in soft decision values output from the soft decision decoder and decides a convergence of the values of the positive/negative bits; and a hard decider that makes a hard decision after the decider decides the convergence of the values of the positive/negative bits.

7. The turbo decoding apparatus of claim 6, wherein the decider compares values of positive/negative bits in current soft decision decoding to values of positive/negative bits in previous soft decision decoding, detects a match or a mismatch in each comparison, and decides a convergence of the current and previous positive/negative bits based on detection results.

8. The turbo decoding apparatus of claim 6, wherein the decider compares values of positive/negative bits in current soft decision decoding to values of positive/negative bits in previous soft decision decoding, detects a match or a mismatch in each comparison, and, upon estimating a convergence of the current and previous positive/negative bits based on detection results, decides whether or not to terminate an iteration of soft decision decoding based on at least one of a history of fluctuation in positive/negative bits and a count of soft decision decoding that has been executed.

* * * * *